(12) United States Patent
Bills et al.

(10) Patent No.: US 9,773,725 B2
(45) Date of Patent: *Sep. 26, 2017

(54) CORELESS MULTI-LAYER CIRCUIT SUBSTRATE WITH MINIMIZED PAD CAPACITANCE

(71) Applicant: INTERNATIONAL BUSINESS MACHINES CORPORATION, Armonk, NY (US)

(72) Inventors: Kevin Bills, Austin, TX (US); Mahesh Bohra, Austin, TX (US); Jinwoo Choi, Austin, TX (US); Tae Hong Kim, Austin, TX (US); Rohan Mandrekar, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/613,893

(22) Filed: Feb. 4, 2015

(65) Prior Publication Data

US 2016/0225705 A1    Aug. 4, 2016

(51) Int. Cl.
*H05K 1/00* (2006.01)
*H05K 1/18* (2006.01)
(Continued)

(52) U.S. Cl.
CPC .. *H01L 23/49822* (2013.01); *H01L 23/49811* (2013.01); *H01L 23/49816* (2013.01); *H01L 23/49827* (2013.01); *H01L 23/49838* (2013.01); *H05K 1/0251* (2013.01); *H05K 1/144* (2013.01); *H01L 24/16* (2013.01); *H01L 2224/16* (2013.01); *H01L 2224/16235* (2013.01); *H01L 2924/10253* (2013.01); *H01L 2924/14* (2013.01); *H01L 2924/15311* (2013.01);
(Continued)

(58) Field of Classification Search
USPC .................................. 361/748; 174/261, 260
See application file for complete search history.

(56) References Cited

U.S. PATENT DOCUMENTS 5,041,881 A     8/1991  Bishop et al.
5,177,670 A *   1/1993  Shinohara ............... H01L 23/36
                                                          174/253
(Continued)

FOREIGN PATENT DOCUMENTS

JP         02-113557 A      4/1990

OTHER PUBLICATIONS

PCOM000101579D: ("Method for a Variable-Size Directional Antipad"); Anonymous Disclosure published Mar. 16, 2005;5 pages.
(Continued)

*Primary Examiner* — Andargie M Aychillhum
(74) *Attorney, Agent, or Firm* — Cantor Colburn LLP; Joseph Petrokaitis

(57) ABSTRACT

A multi layer interconnecting substrate has at least two spaced apart metal layers with a conductive pad on each one of the metal layers. Two different types of insulating layers are placed between the metal layers. The placement is such that one of the two different types of insulating layers is placed between the conductive pads and the other type of insulating layer is placed between the two spaced apart metal layers.

10 Claims, 4 Drawing Sheets

(51) Int. Cl.
  *H05K 7/00*    (2006.01)
  *H01L 23/498*  (2006.01)
  *H05K 1/14*    (2006.01)
  *H01L 23/00*   (2006.01)
  *H05K 1/02*    (2006.01)

(52) U.S. Cl.
  CPC .............. *H01L 2924/16152* (2013.01); *H01L 2924/3011* (2013.01); *H05K 1/0231* (2013.01); *H05K 2201/0187* (2013.01); *H05K 2201/041* (2013.01); *H05K 2201/09481* (2013.01); *H05K 2201/09718* (2013.01); *H05K 2201/10734* (2013.01); *Y10T 29/49124* (2015.01); *Y10T 29/49151* (2015.01)

(56) References Cited

U.S. PATENT DOCUMENTS

| | | |
|---|---|---|
| 5,786,793 A | 7/1998 | Maeda et al. |
| 6,011,167 A | 1/2000 | Tashiro et al. |
| 6,072,690 A | 6/2000 | Farooq et al. |
| 6,091,375 A | 7/2000 | Goto et al. |
| 6,200,400 B1 | 3/2001 | Farooq et al. |
| 6,392,164 B1 | 5/2002 | Iwaki et al. |
| 6,430,030 B1 | 8/2002 | Farooq et al. |
| 6,521,970 B1 | 2/2003 | Takiar et al. |
| 6,559,531 B1 | 5/2003 | Sutherland |
| 6,642,622 B2 | 11/2003 | Usui et al. |
| 6,765,298 B2 | 7/2004 | Chin et al. |
| 7,501,586 B2 | 3/2009 | Wig et al. |
| 7,535,689 B2 | 5/2009 | Zeng et al. |
| 7,649,748 B2 | 1/2010 | Kariya et al. |
| 7,755,910 B2 | 7/2010 | Mashino |
| 7,800,916 B2 | 9/2010 | Blackwell et al. |
| 7,936,568 B2 | 5/2011 | Mashino |
| 8,389,870 B2 * | 3/2013 | Bills ................ H01L 23/49822 174/253 |
| 2002/0016021 A1 | 2/2002 | Sutherland |
| 2002/0036099 A1 | 3/2002 | Hachiya |
| 2003/0011560 A1 | 1/2003 | Albert et al. |
| 2005/0011675 A1 | 1/2005 | Barr et al. |
| 2005/0018382 A1 | 1/2005 | Takazawa |
| 2005/0146390 A1 | 7/2005 | Baek |
| 2005/0153610 A1 | 7/2005 | McCarthy |
| 2005/0205295 A1 | 9/2005 | Tsuk |
| 2005/0221601 A1 | 10/2005 | Kawano |
| 2006/0137905 A1 | 6/2006 | Kariya et al. |
| 2006/0237228 A1 | 10/2006 | Lin et al. |
| 2006/0264040 A1 | 11/2006 | Takada et al. |
| 2007/0045000 A1 | 3/2007 | Lin et al. |
| 2007/0045860 A1 | 3/2007 | Nakamura |
| 2007/0117338 A1 | 5/2007 | Yamamoto et al. |
| 2007/0121273 A1 | 5/2007 | Yamamoto et al. |
| 2007/0221400 A1 | 9/2007 | Kurashina et al. |
| 2008/0038162 A1 | 2/2008 | Koshiishi et al. |
| 2008/0244902 A1 | 10/2008 | Blackwell et al. |
| 2008/0265392 A1 | 10/2008 | Kawano |
| 2009/0145649 A1 | 6/2009 | Horiuchi et al. |
| 2009/0189241 A1 | 7/2009 | Chow et al. |
| 2009/0189674 A1 | 7/2009 | Chow et al. |
| 2009/0205850 A1 | 8/2009 | Chow et al. |
| 2009/0215261 A1 | 8/2009 | Kawano |
| 2009/0241332 A1 | 10/2009 | Lauffer et al. |
| 2010/0033354 A1 | 2/2010 | Ejlersen |

OTHER PUBLICATIONS

Advance Package Technology; Intel Technology Journal, vol. 09 Issue 04, Nov. 9, 2005.
Air Gap Transmission Lines on Organic substrates for Loss Interconnect, IEEE Transaction Microwave Theory and Tecnology, vol. 55 No. 9 Sep. 2007.

* cited by examiner

CORELESS MULTI-LAYER CIRCUIT SUBSTRATE WITH MINIMIZED PAD CAPACITANCE

CROSS REFERENCE TO RELATED PATENT APPLICATION

This application is a division of application Ser. No. 13/614,314, filed on Sep. 13, 2012 which is a divisional of application Ser. No. 12/720,386, filed on Mar. 9, 2010. The present application claims all benefits, including the filing dates that the referenced applications are entitled.

BACKGROUND

The present invention relates to semiconductor devices, in general, and in particular to multilayer resin substrates that are used to interconnect the semiconductor devices to an external system such as a printed circuit board (PCB) or the like.

The majority of original equipment manufacturers (OEMs) use third party electronic devices in their electrical products. The electrical devices may be off the shelf components or custom made. A typical third party electrical device usually consists of an integrated circuit (IC) chip operatively connected to a substrate which is used to connect the electrical device to the OEM products. The typical substrate is a stacked structure consisting of a plurality of resinous layers connected to a metallic core. Electrical conductors are fabricated on respective layers and within vias that interconnect the layers. As a consequence, there are a plurality of communication paths that allow the transmission of electrical signals between the IC chip and the system to which it is connected.

The packaging technology has been successful in improving the transmission characteristics of the substrate by shrinking the thickness of the core. As a consequence, the substrate structure has evolved from a thick core to a thin core and finally to no core. The no core structure is often referred to as a coreless structure which has several attractive features and may trump the use of other designs as soon as it is fully accepted within the electronic packaging industry.

SUMMARY OF THE INVENTION

An embodiment of the present disclosure describes an interconnecting system termed a substrate that includes a coreless multi layer stack mounted on a base. The base includes a first (lower) metallic layer and a second (upper) metallic layer. The metallic layers are arranged in spaced relation with a first insulating layer interpose between them. A ball grid area (BGA) pad in the form of a circle is fabricated on the lower of the two metallic layers. A conductive member or pad that provides electrical continuity with the BGA pad is fabricated on the upper metallic layer. A second insulating layer is interposed between the BGA pad on the lower metallic layer and the conductive member on the upper metallic layer. The first insulating layer and the second insulating layer are in lateral abutment, with each having a different dielectric constant.

In a second embodiment of the disclosure a semiconductor chip is mounted on the substrate described above.

In another embodiment of the present disclosure an air gap is formed between the BGA pad on the lower metallic layer and the conductive member on the upper metallic layer.

In yet another embodiment of the present disclosure the semiconductor chip and the substrate are mounted on a printed circuit board (PCB), such as a printed circuit board for a computer.

DESCRIPTION OF EMBODIMENTS

Figure 1:
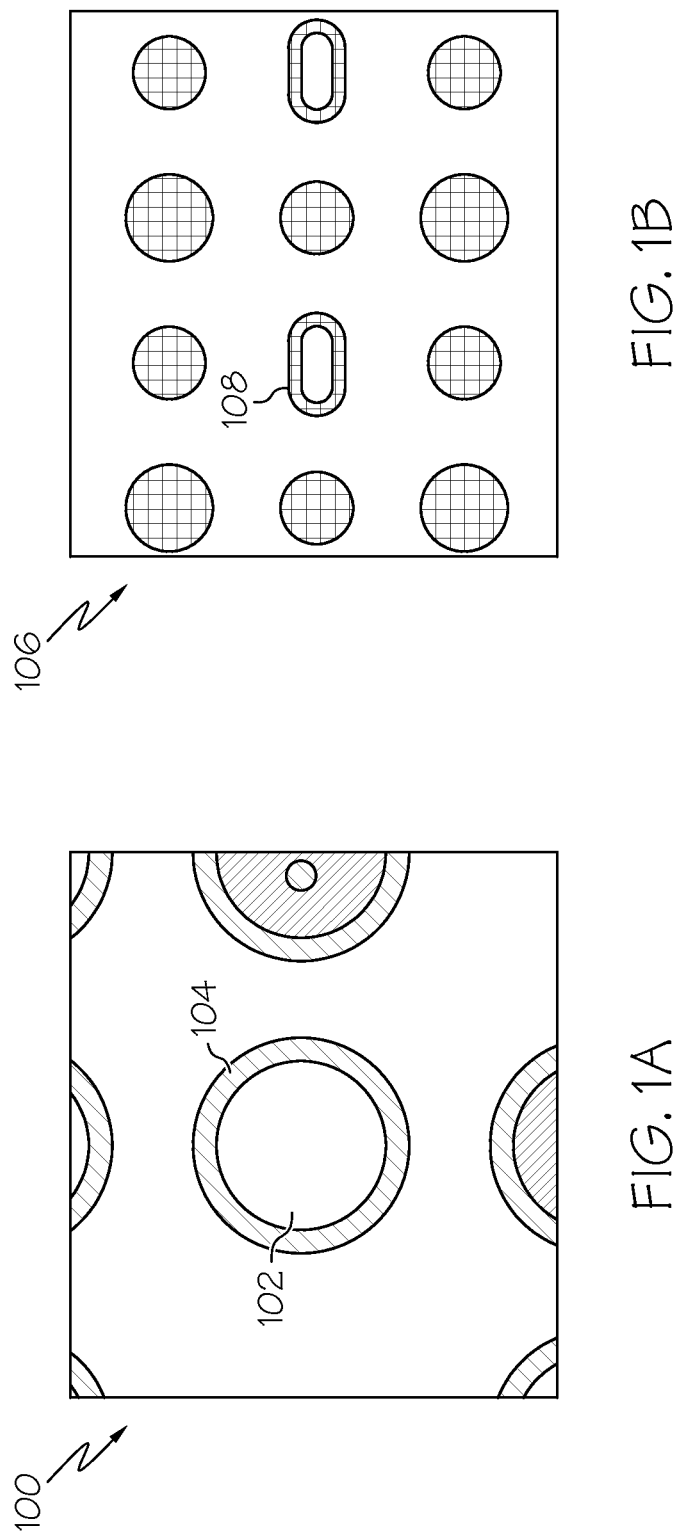
FIG. 1A and FIG. 1B depict a side by side plane view of the two bottom metal layers of the interconnecting substrate according to an embodiment of the present disclosure.

FIG. 1A and FIG. 1B show a plane view of two metallic layers of a multilayer interconnecting substrate according to an embodiment of the present disclosure. The two metallic layers are shown in a disassembled side-by-side orientation. When assembled, the metallic layer 100 is placed next to an external system (not shown) that is connected to the multilayer substrate. This layer is the lowest layer in the multilayer substrate and is, hereafter referred to as bottom metallic layer 100. The Ball Grid Area (BGA) 102 is fabricated on the bottom metallic layer 100. The BGA 102 is conductive and provides electrical communication for a single signal line (not shown) between the multilayer substrate and the external system. A groove or trench 104 that provides electrical isolation between BGA pad 102 and bottom metallic layer 100 is fabricated around BGA pad 102. As can be seen from the figure other BGA pads (shown in partial views) are fabricated on bottom metallic layer 100 and serve the same purpose as previously described for BGA pad 102. As a consequence, the partially shown BGA pads will not be discussed further.

Still referring to FIG. 1A and FIG. 1B, a plurality of conductive pads, only one of which is labeled 108, are fabricated on metallic layer 106. The conductive pad 108 and others shown but not labeled provide electrical communication between the upper layers of the substrate and the BGA pads on bottom metallic layer 100. When assembled, the metallic layer 106 is placed above and in spaced relation to bottom metallic layer 100. The alignment between the bottom metallic layer 100 and metallic layer 106 is such that the conductive pads, such as pad 108, on metallic layer 106 are in linear alignment with BGA pads, such as BGA pad 102, on the bottom metallic lawyer 100.

Figure 3:
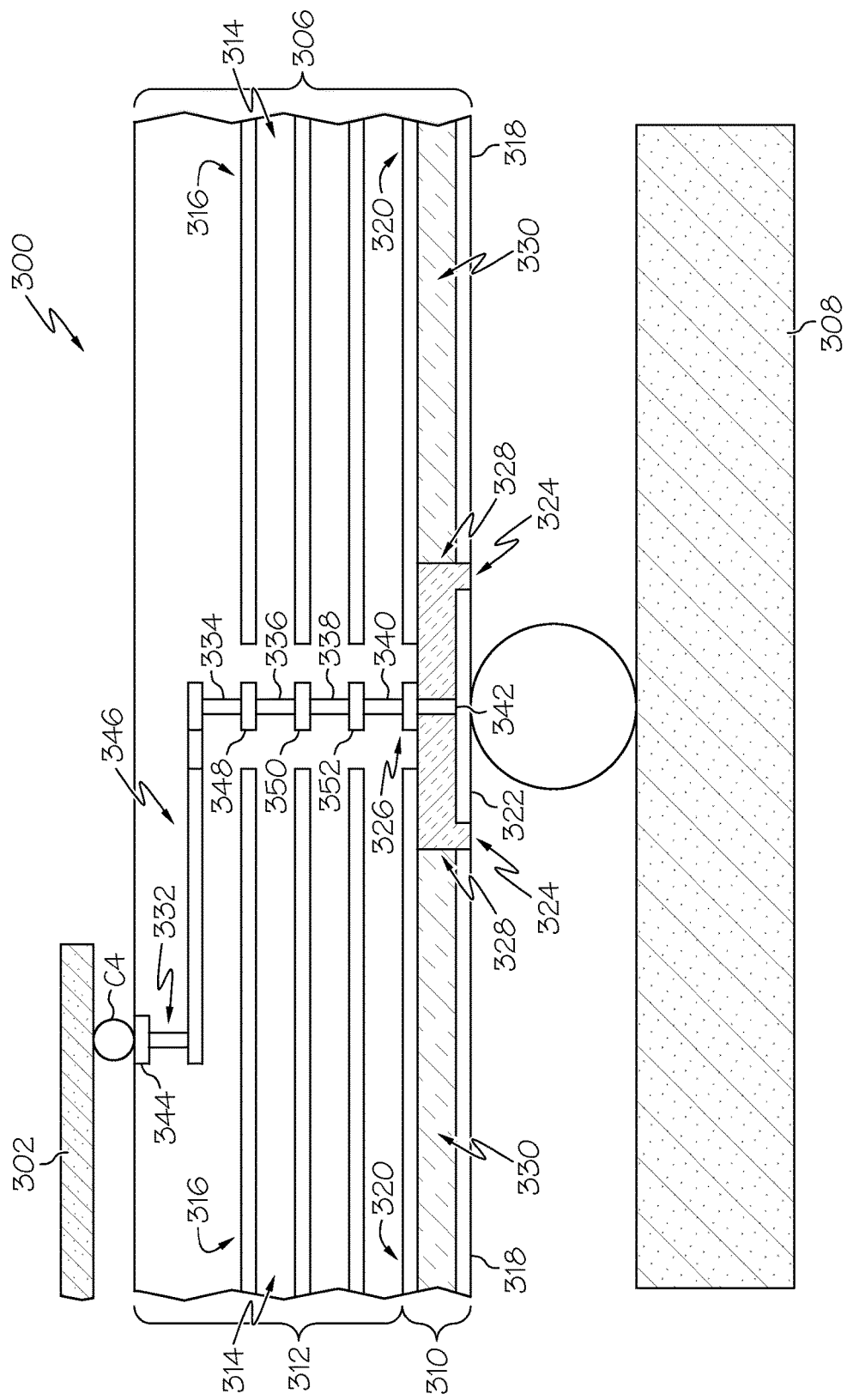
FIG. 3 depicts a cross section of the system shown in FIG. 2.

When the two metallic layers or plates are assembled, as described herein, bottom metallic layer 100 is the lowest bottom layer and metallic layer 106 is the next lowest bottom layer in the multilayer substrate stack. When the multi layer substrate stack includes a coreless structure, an excessive pad capacitance is developed between pads in the lowest bottom layer and the metal in the next lowest bottom layer. This excessive pad capacitance adversely affects the quality of electrical signals that are propagated through the substrate. The adverse effect is felt at high frequencies (usually at 4 GHz and above). Most communication system operates in the high frequency range. Therefore, without solving this problem, it is doubtful that the coreless technology will ever be the dominant packaging technology, even though the coreless technology provides a much lower manufacturing cost than the traditional core package technology. FIG. 3 shows first insulator 328 in linear contact or linear abutment with second insulator 330. Additional information regarding the characteristics of insulator 328 and 330, respectively, are set forth below in this document. By configuring first insulator 328 and second insulator 330 as demonstrated in FIG. 3 and including the characteristics set forth below for each insulator, the problem set forth above is solved. In particular, capacitance is reduced and signal quality is improved.

Figure 2:
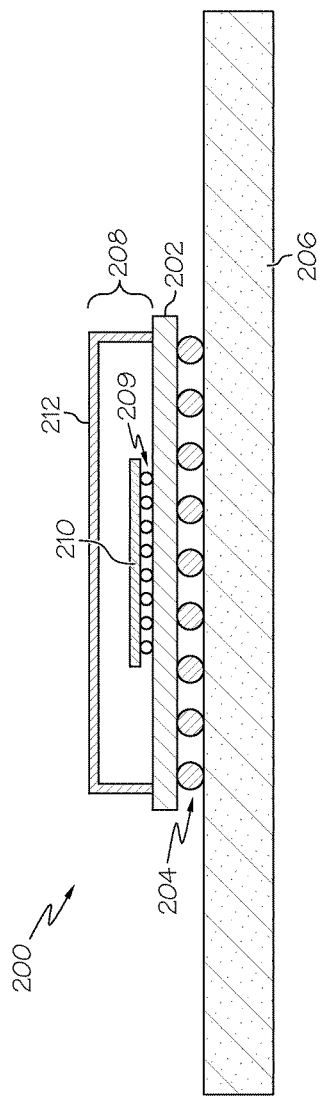
FIG. 2 depicts a system including a substrate according to an embodiment of the present disclosure.

FIG. 2 shows a system 200 including a multi layer substrate or laminate module 202 fabricated according to teachings of an embodiment of the present disclosure. The terminologies substrate and laminate module are used interchangeably throughout this document. The laminate module 202 is coupled by a plurality of BGA pads 204 to a printed circuit board (PCB) 206, such as a mother board for a computer or the like. As stated previously, each of the BGA pad is associated with a single signal wire and forms the exchange point between the PCB 206 and the laminate module 202 for signals on the associated wire. A semiconductor chip 208 is connected to the laminate module 202 by a group of C4 solder balls 209. The semiconductor chip 208 includes a silicon die 210 and a cover or lid 212 to protect the silicon die that contains the circuits and the transistors operating to provide functions associated with the semiconductor chip. For example, if the semiconductor chip is a processor it would provide the functions associated with a processor. Likewise, if the chip is a memory chip it would perform memory functions and so forth. By applying heat to the C4 balls the semiconductor chip 208 can be firmly attached to the laminate module 202.

FIG. 3 shows a cross section 300 of the system shown in FIG. 2. In order to establish connectivity between the FIGS. components that are common to the FIGS. are identified with the same name but with different numerals. As a consequence, silicon die 302 is coupled by C4 solder balls (only one is shown) to Laminate Module 306 which is coupled by BGA pads (only one is shown) to Printed Circuit Board (PCB) 308. The silicon die, C4 solder balls, BGA pads, and PCB have already been described and will not be discussed further in this document.

Still referring to FIG. 3, the substrate or laminate module 306 is a unified structure including a base 310 and a coreless multi layer resin structure 312 connected to the base. The layers in the coreless multi layer resin structure are substantially the same. Therefore, the description of one is intended to cover the others. Each of the layers includes a non conductive part 314 and a conductive part 316 which is usually located on the top surface of the layer. The non conductive part is at the bottom of the layer and forms an insulating barrier between respective layers of the structure. The non conductive part may be fabricated from resin material or other insulating material. The conductive part of the layers is primarily metal and may be partitioned into electrical conductors or other pattern as the designer sees fit.

Still referring to FIG. 3, the base 310 includes lower metal layer 318 and upper metal layer 320. A BGA pad 322 is fabricated in the lower metal layer 318. As previously described the BGA pad 322 terminates a single electrical conductor. A trace of the single conductor will be given below. A groove or slot 324 is placed around the BGA 322. The groove or slot provides electrical isolation between the lower metal layer 318 and BGA pad 322. A conductive pad 326 is fabricated in the upper metal layer 320. The conductive pad 326 and the BGA pad 322 form part of a conductor that transmits electrical signals through the system. As stated above, it has been determined that excessive capacitance between the pads adversely affect signal quality. To correct this problem, a first insulator 328 with a first dielectric constant is placed between BGA pad 322 on the lower metal layer 318 and the conductive pad 326 in upper metal layer 320. A second insulator 330 with a second dielectric constant is placed between the lower metal layer 318 and the upper metal layer 320. The first insulator 328 and the second insulator 330 are in lateral abutment between the upper metal layer 320 and the lower metal layer 318. The dielectric constants for the two insulators are different. For example, the dielectric constant for the first insulator may be set equal to 2, whereas the dielectric constant for the second insulator may be set equal to 3.4. It should be noted other appropriate values can be selected by those skilled in the art without deviating from the teachings or spirit of the present disclosure.

In one embodiment of the present disclosure the first insulator 328 is replaced by air. This can be achieved by machining a cavity within the upper surface of the BGA pad 322. The cavity is then filled with heat sensitive material that can be dissipated during the manufacturing process thereby forming an air gap between the BGA pad 322 and conductive pad 326. Other processes or ways of forming an air gap between BGA pad 322 and conductive pad 326 are well within the skills of one skilled in the art. Therefore, any such implementation of processes or ways is intended to be covered by teachings of the present invention.

Still referring to FIG. 3, an example of a continuous conductor through the structure is shown. The conductor begins at pad 344, located in the first layer of the structure, and terminates in BGA pad 322. The intermediate points between the two end points include vias 332, 334, 336, 338, 340, 342, and pads 344, 348, 350, 352, and 326. It should be noted that the total height of the stack and the height of each layer within the stack are a matter of design choices. Therefore, neither the height of the stack nor the height of the layers within the stack should be construed as a limitation on the scope of the present invention.

Figure 4:
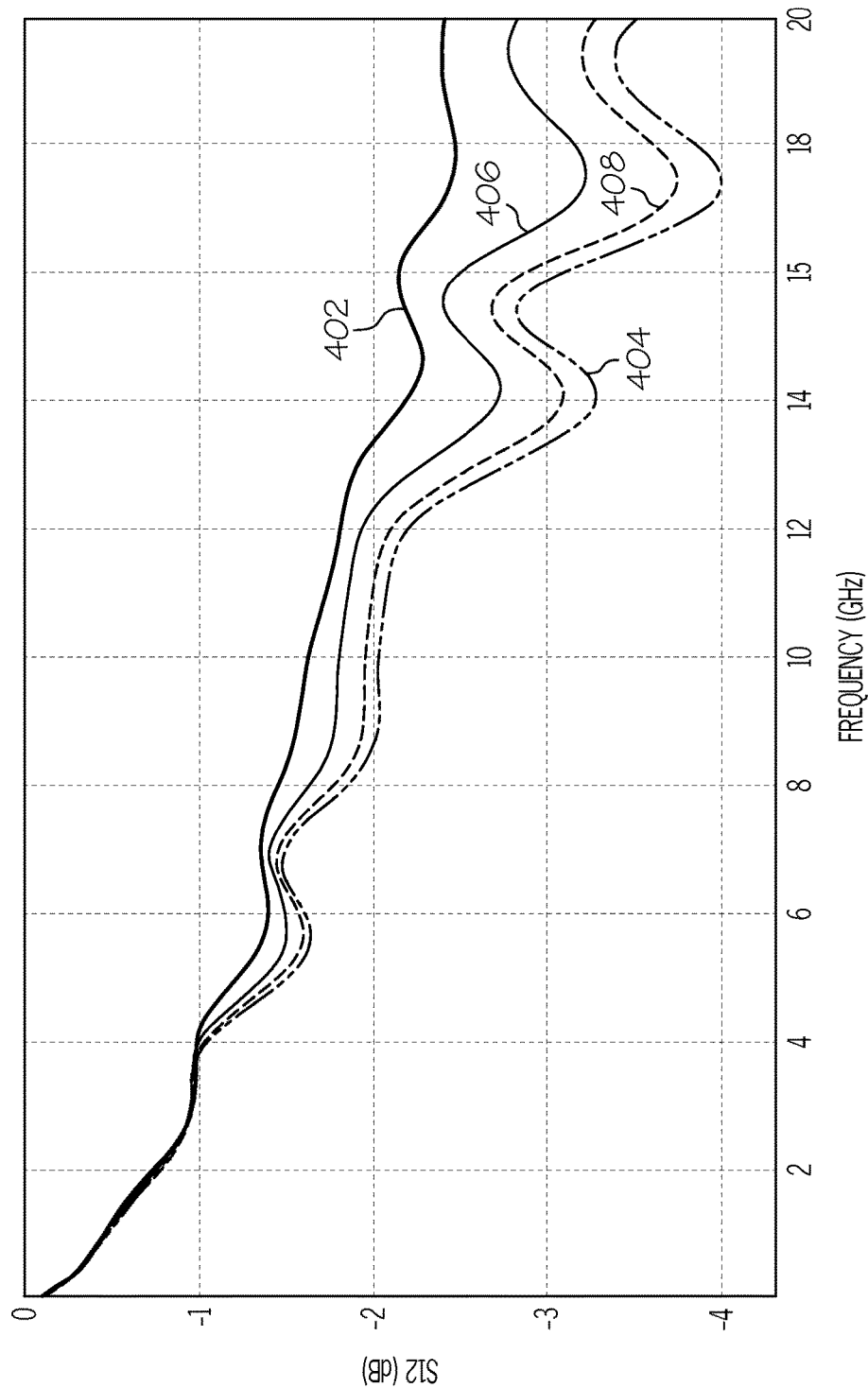
FIG. 4 depicts a diagram of signal traces generated from the simulation of different substrate packages with different pad capacitance. The diagram demonstrates the improvement made to coreless substrates by the present invention.

FIG. 4 depicts a graphical representation of simulated signals generated from different simulated core and coreless packages with different pad capacitance. This graphical representation demonstrates the improvement that the present invention adds to the coreless packaging technology. Some simulations were performed in order to provide reasonable comparison between the various packages. In particular, a 40 mm package trace with 50 ohm characteristic impedance and a capacitive discontinuity in the middle. The value of this capacitance-discontinuity was varied such that it would reflect the parallel plate capacitance between a circular BGA pad and a reference plane above it. Depending on the dielectric medium used, the transmission line was simulated using various capacitance-discontinuity values.

Still referring to FIG. 4, insertion losses in decibel (dB) are represented by S12 (dB) and is plotted on the vertical axis. The frequencies in GHz are plotted on the horizontal axis. The signal trace 402 from a traditional core package is used as the standard. The signal trace 404 represents the trace from a coreless package. The coreless package, according to the teachings of an embodiment of the present disclosure, with air between the BGA pad on the bottom metal layer and the conductive pad on the next to bottom metal layer generates the signal trace 406. The coreless package, according to teachings of the present disclosure, with a relatively low dielectric constant, for example 2 or less, between the BGA pad on the bottom metal layer and the conductive pad on the next to the bottom metal layer generates the signal trace 408. The closeness of the signal traces to the standard signal trace 402 the better are the signal characteristics; As a consequence, the quality of signal characteristics for coreless interconnecting substrates rank in descending order are provided by traces 406, 408, and 404.

It is clear from the above discussion that the signal characteristics of a coreless package are greatly enhanced when the package includes a substrate that practices the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications are suited to the particular use contemplated.

What is claimed is:

1. An interconnecting substrate comprising:
    a multilayer laminated structure in which each of the layers includes an insulating part and a non insulating part; and
    a base operatively connected to the laminated structure wherein said base includes a first metal layer;
        a BGA pad fabricated in said first metal layer;
        a second metal layer oppositely placed and in spaced relation to the first metal layer;
        a conductive pad fabricated in said second metal layer;
        a first insulating layer having a first dielectric constant interpose between the BGA pad and the conductive pad; and
        a second insulating layer having a second dielectric constant interpose between the first metal layer and the second metal layer wherein said first insulating layer and said second insulating layer are separate layers and said second insulating layer is in linear contact with the first insulating layer.

2. The interconnecting substrate of claim 1 wherein the multilayer laminated structure includes a coreless structure.

3. The interconnecting substrate of claim 1 wherein the BGA pad includes a circular structure.

4. The interconnecting substrate of claim 1 further including a semiconductor chip operatively coupled to the multilayer laminated structure.

5. The interconnecting substrate of claim 1 wherein one of the first insulating layer and the second insulating layer includes air.

6. The interconnecting substrate of claim 1 wherein the first dielectric constant and the second dielectric constant are 2.0 and 3.4 respectively.

7. The interconnecting substrate of claim 4 wherein the semiconductor chip includes a processor.

8. The interconnecting substrate of claim 1 wherein the first dielectric constant and the second dielectric constant have different values, and wherein capacitance within said interconnecting substrate is reduced to enhance quality of transmitted electrical signal.

9. The interconnecting substrate of claim 1 further including a printed circuit board operatively connected to the base.

10. The interconnecting substrate of claim 9 wherein the printed circuit board includes a mother board for a computer.

\* \* \* \* \*